US009148148B2

(12) United States Patent
Park et al.

(10) Patent No.: US 9,148,148 B2
(45) Date of Patent: Sep. 29, 2015

(54) GATE DRIVING CIRCUIT AND DISPLAY APPARATUS HAVING THE SAME

(75) Inventors: Kyung-Ho Park, Cheonan-si (KR);
Si-Hyun Ahn, Cheonan-si (KR);
Dong-Hee Shin, Seoul (KR);
Hyung-Jun Park, Seongnam-si (KR);
So-Young Kim, Jeju-si (KR); Soo-Hyun Kim, Chungju-si (KR)

(73) Assignee: Samsung Display Co., Ltd., Yongin (KR)

( * ) Notice: Subject to any disclaimer, the term of this patent is extended or adjusted under 35 U.S.C. 154(b) by 1209 days.

(21) Appl. No.: 13/083,295

(22) Filed: Apr. 8, 2011

(65) Prior Publication Data

US 2012/0105398 A1     May 3, 2012

(30) Foreign Application Priority Data

Oct. 28, 2010    (KR) ........................ 10-2010-0105934

(51) Int. Cl.
*G09G 3/00*      (2006.01)
*H03K 19/0185*   (2006.01)
*G09G 3/36*      (2006.01)

(52) U.S. Cl.
CPC ...... *H03K 19/018521* (2013.01); *G09G 3/3677* (2013.01); *G09G 2310/0286* (2013.01)

(58) Field of Classification Search
CPC .................... G09G 3/3677; G09G 2310/0286
USPC .................................................. 345/100, 205
See application file for complete search history.

(56) References Cited

U.S. PATENT DOCUMENTS

| 2005/0083292 | A1* | 4/2005 | Moon et al. | 345/100 |
| 2008/0278467 | A1* | 11/2008 | Hwang et al. | 345/205 |
| 2009/0167668 | A1* | 7/2009 | Kim | 345/100 |

* cited by examiner

*Primary Examiner* — Amare Mengistu
*Assistant Examiner* — Joseph G Rodriguez
(74) *Attorney, Agent, or Firm* — H.C. Park & Associates, PLC (57) ABSTRACT

Provided is a gate driving circuit including cascade-connected stages that output gate signals. An n-th one of the stages ("n" is a natural number) includes a pull-up part, a pull-up controller, a first pull-down part, a second pull-down part, and a pull-down controller. The pull-up part outputs a first clock signal as an output signal of the n-th stage. The pull-up controller selectively applies first and second powers to a control electrode of the pull-up part. The first pull-down part pulls down a voltage applied to the control electrode of the pull-up part to an off voltage. The second pull-down part pulls down a voltage applied to an output electrode of the pull-up part to the off voltage. The pull-down controller selectively applies the first and second powers to control electrodes of the first and second pull-down parts.

16 Claims, 7 Drawing Sheets

<FORWARD DIRECTION>

FIG. 4B

<REVERSE DIRECTION>

GATE DRIVING CIRCUIT AND DISPLAY APPARATUS HAVING THE SAME

CROSS REFERENCE TO RELATED APPLICATION

This application claims priority from and the benefit of Korean Patent Application No. 10-2010-0105934, filed on Oct. 28, 2010, the disclosure of which is incorporated herein in its entirety by reference.

BACKGROUND OF THE INVENTION

1. Field

Exemplary embodiments of the present invention relate to a gate driving circuit and a display apparatus having the gate driving circuit.

2. Description of the Related Art

Amorphous silicon gate (ASG) technology has been developed to decrease manufacturing costs of a display panel module of a display apparatus and to decrease the total size of the display apparatus. In the ASG technology, a gate driving circuit and a switching element are respectively formed in a peripheral area of a display panel and in a display area of the display panel. When the gate driving circuit is directly formed in the peripheral area of the display panel, the gate driving circuit sequentially outputs gate signals in a predetermined order.

In a recently developed display panel, a forward direction image is normally displayed and a reverse direction image is displayed by rotating the display panel by an angle of about 180 degrees, according to a driving mode. In driving the above-mentioned display panel, an output order of the gate driving circuit integrated on the display panel is fixed, so that an output order of image data should be changed.

SUMMARY OF THE INVENTION

Exemplary embodiments of the present invention provide a gate driving circuit capable of bi-directional driving.

Exemplary embodiments of the present invention also provide a display apparatus having the gate driving circuit.

Additional features of the invention will be set forth in the description which follows, and in part will be apparent from the description, or may be learned by practice of the invention.

A gate driving circuit, according to an exemplary embodiment of the present invention, includes a plurality of cascade-connected stages and outputs a plurality of gate signals. An n-th stage ("n" is a natural number) includes a pull-up part, a pull-up controller, a first pull-down part, a second pull-down part, and a pull-down controller. The pull-up part outputs a first clock signal as an output signal of the n-th stage. The pull-up controller selectively applies a first power and a second power to a control electrode of the pull-up part. The first pull-down part pulls down a voltage applied to the control electrode of the pull-up part to an off voltage. The second pull-down part pulls down a voltage applied to an output electrode of the pull-up part to the off voltage. The pull-down controller selectively applies the first power and the second power to control electrodes of the first and second pull-down parts.

A display apparatus, according to another exemplary embodiment of the present invention, includes a display panel, a gate driving circuit, and a main driving circuit. The display panel includes a display area in which an image is displayed and a peripheral area surrounding the display area. A plurality of gate lines and a plurality of data lines are formed in the display area. The gate driving circuit is integrated in the peripheral area, and includes a plurality of stages to output gate signals to the gate lines. The main driving circuit provides a first power, a second power, a first gate start signal, and a second gate start signal to the gate driving circuit, according to a display direction of an image displayed on the display panel. An n-th ("n" is a natural number) stage of the gate driving circuit includes a pull-up part to output a first clock signal as an output signal of the n-th stage, a pull-up controller to selectively apply the first and second powers to a control electrode of the pull-up part, a first pull-down part to pull down a voltage applied to the control electrode of the pull-up part to an off voltage, a second pull-down part to pull down a voltage applied to an output electrode of the pull-up part to the off voltage, and a pull-down controller to selectively apply the first power and the second power to control electrodes of the first and second pull-down parts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 1:
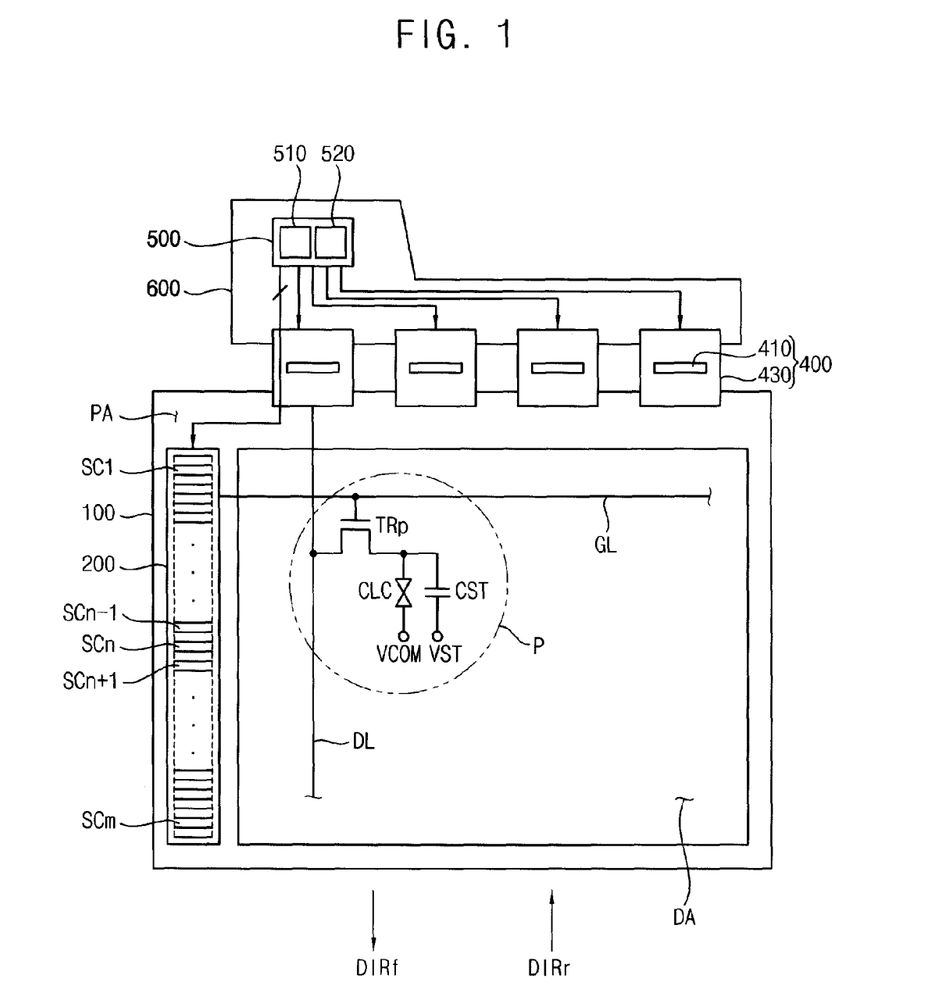
FIG. 1 is a plan view illustrating a display apparatus, according to an exemplary embodiment of the present invention.

FIG. 1 is a plan view illustrating a display apparatus, according to an exemplary embodiment of the present invention. Referring to FIG. 1, the display apparatus includes a display panel 100, a gate driving circuit 200, a data driving circuit 400, a main driving circuit 500, and a printed circuit board 600.

The display panel 100 includes a display area DA and a peripheral area PA surrounding the display area DA. Gate lines, data lines, and pixels P are formed in the display area DA. Each of the pixels P includes a pixel switching element TRp electrically connected to a gate line GL and a data line DL, a liquid crystal capacitor CLC electrically connected to the pixel switching element TRp, and a storage capacitor CST connected in parallel to the liquid crystal capacitor CLC.

The data driving circuit 200 is integrated in the peripheral area PA corresponding to end portions of the gate lines and includes a shift register to sequentially output gate signals, which turn on the pixel switching elements TRp connected to the corresponding gate lines. The shift register includes stages SC1, . . . , SCn−1, SCn, SCn+1, . . . , SCm ("m" is a natural number, n<m). Each stage includes a plurality of transistors. The transistors may be formed via a manufacturing process used to form the pixel switching element TRp of the pixel P. Although not shown in figures, a second gate driving circuit 200 may be included in the peripheral area PA to the right of the gate lines GL.

The data driving circuit 400 includes a source driving chip 410 to output data signals to the data lines DL, and a flexible printed circuit (FPC) board 430. The source driving chip 410 is mounted on the FPC board 430, and the FPC board 430 electrically connects the printed circuit board 600 with the display panel 100. In the present exemplary embodiment, the source driving chip 410 is mounted on the FPC board 430. Alternatively, the source driving chip 410 may be directly mounted on the display panel 100. In addition, the transistors of the source driving chip 410 may be directly formed in the peripheral area PA, via the same manufacturing process used to form the pixel switching element TRp in the display area DA.

The main driving circuit 500 is mounted on the printed circuit board 600 and respectively provides gate control signals and data control signals to the gate driving circuit 200 and the data driving circuit 400.

For example, the main driving circuit 500 may include a gate control signal generating part 510 and a voltage generating part 520. The gate control signal generating part 510 receives a gate start signal STVP, a gate clock signal CPV, a high voltage VH and a low voltage VL. The gate control signal generating part 510 generates a gate control signal. The gate control signal may include a first gate start signal STVP1, a second gate start signal STVP2, a first clock signal CK1 and a second clock signal CK2. The voltage generating part 520 may generate an off voltage VSS, a first power VDD1, and a second power VDD2 which are provided to the gate driving circuit 200. The low voltage VL may be about −5 to −15V, the high voltage VH may be about 27V. The off voltage may be same or different to the low voltage VL. The high voltage VH, the low voltage VL, the off voltage may have various voltage levels.

The first gate start signal STVP1, the second gate start signal STVP2, a first power VDD1, and a second power VDD2 may have a first level voltage and a second level voltage, according to a direction in which images are displayed on the display panel 100.

For example, the first and second gate start signal STVP1 and STVP2 may have the high voltage VH and the low voltage VL being about −7V. The first and second power VDD1 and VDD2 may have the high voltage VH and the low voltage VL.

The gate driving circuit 200 includes a plurality of stages SC1, . . . , SCn−1, SCn, SCn+1, . . . , SCm to provide the gate signals to the gate lines. The gate driving circuit 200 sequentially drives the stages SC1, . . . , SCn−1, SCn, SCn+1, . . . , SCm during a forward driving mode DIRf. The gate driving circuit 200 sequentially drives the stages SCm, . . . , SCn+1, SCn, SCn−1, . . . , SC1 during a reverse driving mode DIRr.

In the forward driving mode DIRf, the gate driving circuit 200 is driven by the first power VDD1 having the high voltage VH, the second power VDD2 having the low voltage VL, and the first gate start signal STVP1. Therefore, the gate driving circuit 200 sequentially outputs first to m-th gate signals G1, . . . , Gn−1, Gn, Gn+1, . . . , Gm. In the reverse driving mode DIRr, the gate driving circuit 200 is reversely driven by the first power VDD1 having the low voltage VL, the second power VDD2 having the high voltage VH, and the second gate start signal STVP2. Therefore, the gate driving circuit 200 sequentially outputs the m-th to first gate signals Gm, . . . , Gn+1, Gn, Gn−1, . . . , G1.

Figure 2:
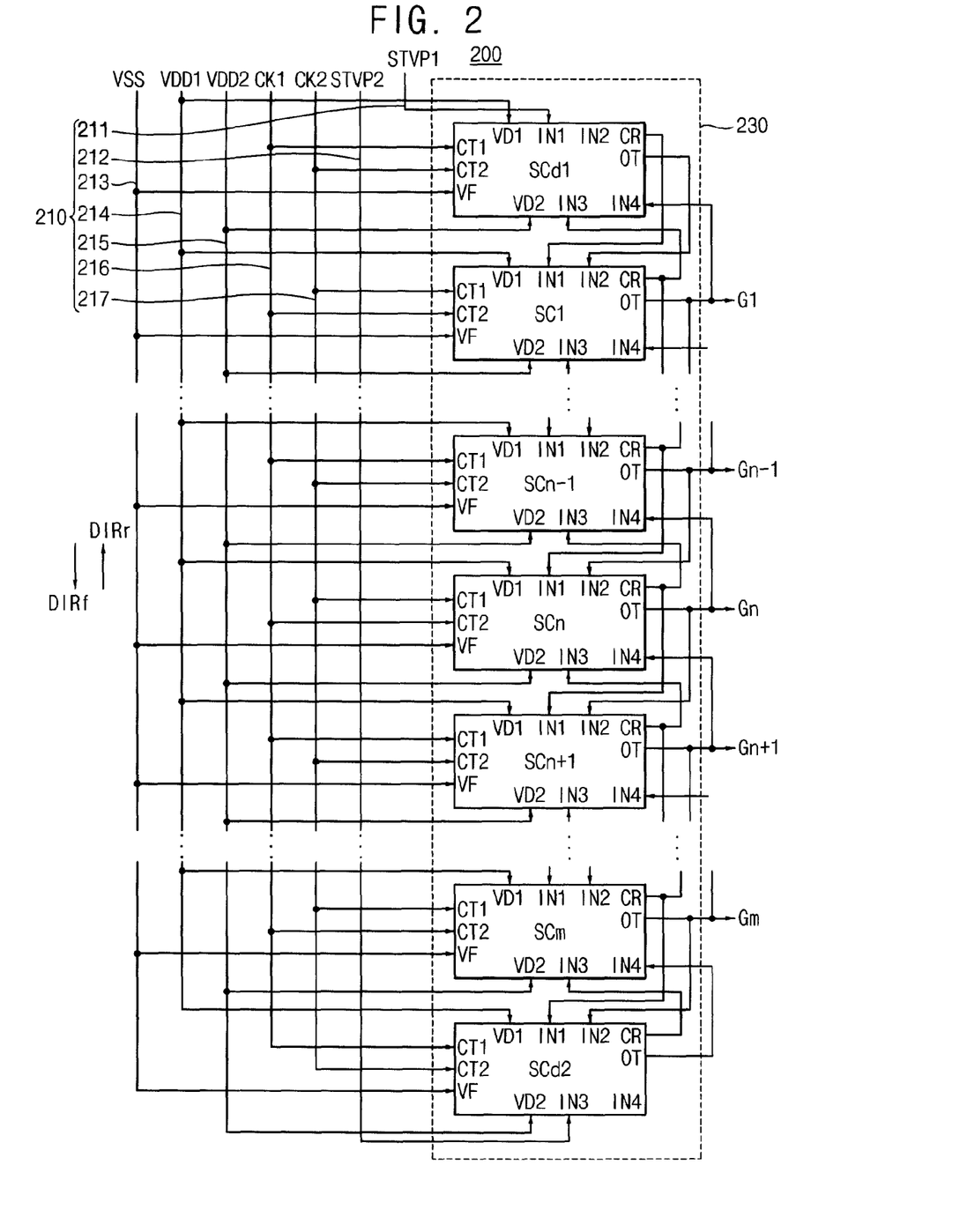
FIG. 2 is a block diagram illustrating a gate driving circuit of FIG. 1.

FIG. 2 is a block diagram illustrating the gate driving circuit 200 of FIG. 1. Referring to FIGS. 1 and 2, the gate driving circuit 200 includes a line part 210 to transmit a plurality of signals, and a shift register electrically connected to the line part 210. The line part 210 includes a first gate start line 211, a second gate start line 212, an off line 213, a first power line 214, a second power line 215, a first clock line 216 and a second clock line 217.

The first gate start line 211 transmits the first gate start signal STVP1. The first gate start signal STVP1 has the high voltage VH in the forward driving mode DIRf and the low voltage VL in the reverse driving mode DIRr. The first gate start signal STVP1 has substantially the same wave structure as a gate signal. For example, the first gate start signal STVP1 may have the high voltage VH during a first horizontal period 1H of one frame, and the low voltage VL during the remaining period of the frame.

The second gate start line 212 transmits the second gate start signal STVP2. The second gate start signal STVP2 has the high voltage VH in the reverse driving mode DIRr, and the low voltage VL in the forward driving mode DIRf. The second gate start signal STVP2 has substantially the same wave structure as the gate signal. For example, the second gate start signal STVP2 may have the high voltage VH during the first horizontal period 1H in one frame, and the low voltage VL during the remaining period of the frame.

The off line 213 transmits the off voltage VSS.

The first power line 214 transmits the first power VDD1. The first power VDD1 has the high voltage VH in the forward driving mode DIRf, and the first power VDD1 has the low voltage VL in the reverse driving mode DIRr.

The second power line 215 transmits the second power VDD2. The second power VDD2 has the off voltage VSS in the forward driving mode DIRf, and the second power VDD2 has the high voltage VH in the reverse driving mode DIRr.

The first clock line 216 transmits the first clock signal CK1. The first clock signal CK1 may be a pulse signal repeating the high voltage VH and the low voltage VL, with a 2H period. A duty rate may be about 50% or less.

The second clock line 217 transmits the second clock signal CK2. The second clock signal CK2 is different from the first clock signal CK1. The second clock signal CK2 may be a pulse signal repeating the high voltage VH and the low voltage VL, in a 2H period. A duty rate may be about 50% or less.

The shift register 230 includes the first to m-th stages SC1~SCm that are cascade-connected, a first dummy stage SCd1, and a second dummy stage SCd2. The first to m-th stages SC1~SCm are connected to m gate lines, and output m gate signals to the m gate lines, respectively. The first dummy stage SCd1 controls the operation of the first stage SC1. The second dummy stage SCd2 controls the operation of the m-th stage SCm. The first dummy stage SCd1 and the second dummy stage SCd2 do not output gates signals to the gate lines.

Each stage includes a first clock terminal CT1, a second clock terminal CT2, a first power terminal VD1, a second power terminal VD2, an off terminal VF, a first input terminal IN1, a second input terminal IN2, a third input terminal IN3, a fourth input terminal IN4, a carry terminal CR and an output terminal OT.

The first clock terminals CT1 receive the first clock signal CK1 or the second clock signal CK2. For example, the first clock terminals CT1 of odd-numbered stages SCd1, ..., SCn−1, SCn+1 ..., SCd2 receives the first clock signal CK1. The first clock terminals CT1 of even-numbered stages SC1, ..., SCn, ..., SCm receive the second clock signal CK2.

The second clock terminals CT2 receive a clock signal different from the clock signal received by the first clock terminals CT1. For example, the second clock terminals CT2 of the odd-numbered stages SCd1, ..., SCn−1, SCn+1 ..., SCd2 receive the second clock signal CK2, and the second clock terminals CT2 of the even-numbered stages SC1, ..., SCn, ..., SCm receive the first clock signal CK1.

The first power terminals VD1 receive a first power VDD1. The first power VDD1 has the high voltage VH, when the gate driving circuit 200 is driven in the forward driving mode DIRf. The first power VDD1 has the low voltage VL when the gate driving circuit 200 is driven in the reverse driving mode DIRr.

The second power terminals VD2 receive the second power VDD2. The second power VDD2 has the low voltage VL, when the gate driving circuit 200 is driven in the forward driving mode DIRf. The second power VDD2 has the high voltage VH, when the gate driving circuit 200 is driven in the reverse driving mode DIRr.

The off terminals VF receive the off voltage VSS to maintain the low level of the gate signal. The off voltage VSS may be same or different to the low voltage VL.

The first input terminals IN1 receive the first gate start signal STVP1, or a carry signal from a previous stage. The carry signal may be synchronized with a gate signal, which is an output signal of the previous stage. For example, the first input terminal IN1 of the first dummy stage SCd1, which is a first stage, receives the first gate start signal STVP1. The first input terminals IN1 of the stages SC1, ..., SCn−1, SCn, SCn+1, ..., SCm, SCd2, except for the first dummy stage SCd1, receive the carry signals from the previous stages, respectively. For example, the previous stage of the n-th stage SCn may be one of the stages SCd1, SC1, ..., SCn−1 preceding the n-th stage SCn.

The second input terminal, IN2 receive the gate signal of the previous stage. For example, the second input terminals IN2 of the stages SC1, ..., SCn−1, SCn, SCn+1, ..., SCm, SCd2 receive the gate signals of the previous stages respectively. For example, the previous stage of the n-th stage SCn may be one of the stages SCd1, SC1, ..., SCn−1 preceding the n-th stage SCn. The second gate start signal STVP2 may be applied to the second input terminal IN2 of the first dummy stage SCd1, which is the first stage.

The third input terminals IN3 receive a carry signal from a following stage. The third input terminals IN3 of the first dummy stage to the m-th stage SCd1, SC1, ..., SCn−1, SCn, SCn+1, ..., SCm receive the carry signals of the following stages. For example, the following stage of the n-th stage SCn may be one of the (n+1)-th to m-th stages SCn+1, ..., SCm. The third input terminal IN3 of the second dummy stage SCd2, which is the last stage, receives the second gate start signal STVP2.

The fourth input terminals IN4 receive a gate signal of the following stages, or a second gate start signal STVP2. The fourth input terminals IN4 of the first dummy stage to the m-th stage SCd1, SC1, ..., SCn−1, SCn, SCn+1, ..., SCm receive the gate signals of the following stages. For example, the following stage of the n-th stage SCn may be one of the (n+1)-th to m-th stages SCn+1, ..., SCm. The first gate start signal STVP1 may be applied to the fourth input terminal IN4 of the second dummy stage SCd2, which is the last stage.

The carry terminals CR output the carry signal synchronized with the gate signal. Each carry terminal CR is electrically connected to the third input terminal IN3 of the previous stage, and is electrically connected to the first input terminals IN1 of the following stages. A carry terminal CR of the first dummy stage SCd1, which is the first stage, is electrically connected to only the first input terminal IN1 of the following stage. A carry terminal CR of the second dummy stage SCd2, which is the last stage, is electrically connected to only the third terminal IN3 of the previous stage. For example, the previous stage of the n-th stage SCn may be one of the stages SCd1, SC1, ..., SCn−1 preceding the n-th stage SCn. The following stage of the n-th stage SCn may be one of the stages SCn+1, ..., SCm, SCd2 following the n-th stage.

The output terminals OT output the gate signal. The output terminals of the first to m-th stages SC1, ..., SCm are electrically connected to respective ones of the gate lines. Each output terminal OT is electrically connected to the fourth input terminals IN4 of a previous stage. Each output terminal OT is electrically connected to the second input terminal IN2 of the following stage. An output terminal OT of the first dummy stage SCd1, which is the first stage, is electrically connected only to the second input terminal IN2 of the following stage. An output terminal OT of the second dummy stage SCd2, which is the last stage, is electrically connected only to the fourth input terminal IN4 of the previous stage. For example, the previous stage of the n-th stage SCn may be one of the stages SCd1, SC1, ..., SCn−1 preceding the n-th stage SCn. The following stage of the n-th stage SCn may be one of the stages SCn+1, ..., SCm, SCd2 following the n-th stage.

Figure 3:
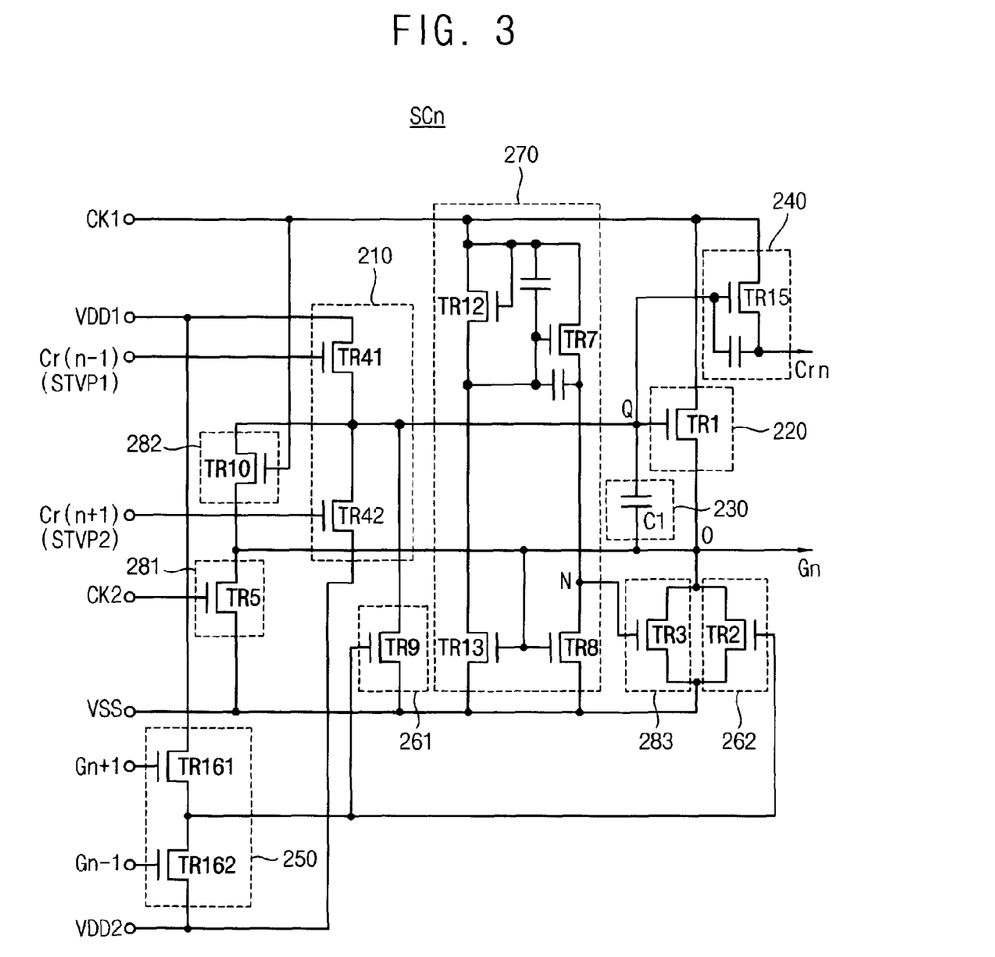
FIG. 3 is a detailed circuit diagram illustrating an n-th stage of FIG. 2.

FIG. 3 is a detailed circuit diagram illustrating an n-th stage of FIG. 2. Referring to FIGS. 2 and 3, the n-th stage SCn includes a pull-up controller 210, a charging part 220, a pull-up part 230, a carry part 240, a pull-down controller 250, a first pull-down part 261, a second pull-down part 262, a switching part 270, a first maintenance part 281, a second maintenance part 282, and a third maintenance part 283.

The pull-up controller 210 applies the first power VDD1 to a first node Q, in the forward driving mode DIRf, and applies the second power VDD2 to the first node Q, in the reverse driving mode DIRr. The pull-up controller 210 includes a first control transistor TR41 and a second control transistor TR42.

The first control transistor TR41 includes a control electrode connected to the carry terminal CR of the previous stage SCn−1, an input electrode connected to the first power terminal VD1, and an output electrode connected to the first node Q. The second control transistor TR42 includes a control electrode connected to the carry terminal CR of the following stage SCn+1, an input electrode connected to the second power terminal VD2, and an output electrode connected to the first node Q.

In the forward driving mode, the first control transistor TR41 applies the first power VDD1 to the first node Q, in response to the carry signal Cr(n−1) from the previous stage SCn−1 having the high voltage VH. The second control transistor TR42 is turned off, as the carry signal Cr(n+1) from the following stage SCn+1 has the low voltage VL. In the reverse driving mode, the second control transistor TR42 applies the second power VDD2 to the first node Q, in response to the carry signal Cr(n+1) from the following stage SCn+1 having the high voltage VH. The first control transistor TR41 is turned off, as the carry signal Cr(n−1) from the previous stage SCn−1 has the low voltage VL.

The pull-up part 230 includes a first transistor TR1. The first transistor TR1 includes a control electrode connected to the first node Q, an input electrode connected to the first clock terminal CT1, and an output electrode connected to the second node O.

The charging part 220 includes a charging capacitor C1. The charging capacitor C1 includes a first electrode connected to the control electrode of the pull-up part 230, and a second electrode connected to the second node Q.

When the first clock terminal CT1 receives the high voltage VH of the first clock signal (CK1), while applying a charged voltage VC charged to the charging part 220 to the control electrode of the pull-up part 230, the pull-up part 230 is bootstrapped. Here, the high voltage VH applied to the first node Q is boosted. When a signal of the first node Q is boosted, the pull-up part 230 outputs the high voltage VH of the first clock signal CK1, as the high voltage VH of the n-th gate signal Gn.

The carry part 240 includes a fifteenth transistor TR15. The fifteenth transistor TR15 includes a control electrode connected to the first node Q, an input electrode connected to the first clock terminal CT1, and an output electrode connected to the carry terminal CR. The carry part 240 further includes a carry capacitor C2 connecting the control electrode with the output electrode. The carry part 240 outputs the high voltage VH, of the first clock signal CK1 received at the first clock terminal CT1, as the n-th carry signal Crn, when the high voltage VH is applied to the first node Q.

The pull-down controller 250 includes a third control transistor TR161 and a fourth control transistor TR162. The third control transistor TR161 includes a control electrode connected to the output terminal OT of the following stage SCn+1, an input electrode connected to the first power terminal VD1, and an output electrode connected to the first and second pull-down parts 261 and 262. The fourth control transistor TR162 includes a control electrode connected to the output terminal OT of the previous stage SCn−1, an input electrode connected to the second power terminal VD2, and an output electrode connected to the first and second pull-down parts 261 and 262. The output electrode of the third control transistor TR161 and the output electrode of the fourth control transistor TR162 are connected to each other.

The pull-down controller 250 turns on the first and second pull-down parts 261 and 262 in response to the gate signal Gn+1 of the following stage SCn+1, in the forward driving mode DIRf. The pull-down controller 250 turns on the first and second pull-down parts 261 and 262 in response to the gate signal Gn−1 of the previous stage SCn−1, in the reverse driving mode DIRr.

Each of the first pull-down parts 261 includes a 9-th transistor TR9. The 9-th transistor TR9 includes a control electrode connected to the pull-down controller 250, an input electrode connected to the first node Q, and an output electrode connected to the off terminal VF. The first pull-down parts 261 applies the off voltage VSS to the first node Q, according to the control of the pull-down controller 250.

Each of the second pull-down parts 262 includes a second transistor TR2. The second transistor TR2 includes a control electrode connected to the pull-down controller 250, an input electrode connected to the second node O, and an output electrode connected to the off terminal VF. Each of the second pull-down parts 262 applies the off voltage VSS to the second node O, according to the control of the pull-down controller 250.

The switching part 270 includes a twelfth transistor TR12, a seventh transistor TR7, a thirteenth transistor TR13, and an eighth transistor TR8. A control electrode of the twelfth transistor TR12 and an input electrode of the twelfth transistor TR12 are connected to the first clock terminal CT1. An output electrode of the 12-th transistor TR12 is connected to an input electrode of the thirteenth transistor TR13 and a control electrode of the seventh transistor TR7. The input electrode of the seventh transistor TR7 is connected to the first clock terminal CT1, and an output electrode of the seventh transistor TR7 is connected to an input electrode of the eighth transistor TR8. The output electrode of the seventh transistor TR7 is connected to a third node N. The switching part 270 controls a voltage applied to the third node N.

The switching part 270 applies a signal synchronized with the first clock signal CK1 received at the first clock terminal CT1, to the third node N. When the high voltage VH is applied to the second node O, the eighth transistor TR8 and the thirteenth transistor TR13 are turned on, so that the voltage of the third node N is discharged as the low voltage VL.

The first maintenance part 281 includes a 5-th transistor TR5. The 5-th transistor TR5 includes a control electrode connected to the second clock terminal CT2, an input electrode connected to the second node O, and an output electrode connected to the off terminal VF. The first maintenance part 281 discharges the voltage of the second node O as the off voltage VSS received at the off terminal VF, in response to the high voltage VH of the second clock signal CK2.

The second maintenance part 282 includes a 10-th transistor TR10. The 10-th transistor TR10 includes a control electrode connected to the first clock terminal CT1, an input electrode connected to the first node Q, and an output electrode connected to the second node O. The second maintenance part 282 maintains the voltage of the first node Q as the off voltage VSS of the second node O, in response to the high voltage VH of the first clock signal CK1.

The third maintenance part 283 includes a third transistor TR3. The third transistor TR3 includes a control electrode connected to the third node N, an input electrode connected to the second node O, and an output electrode connected to the off terminal VF. The third maintenance part 283 maintains the voltage of the second node O as the off voltage VSS received at the off terminal VF, when the high voltage VH is applied to the third node N.

Figure 4A:
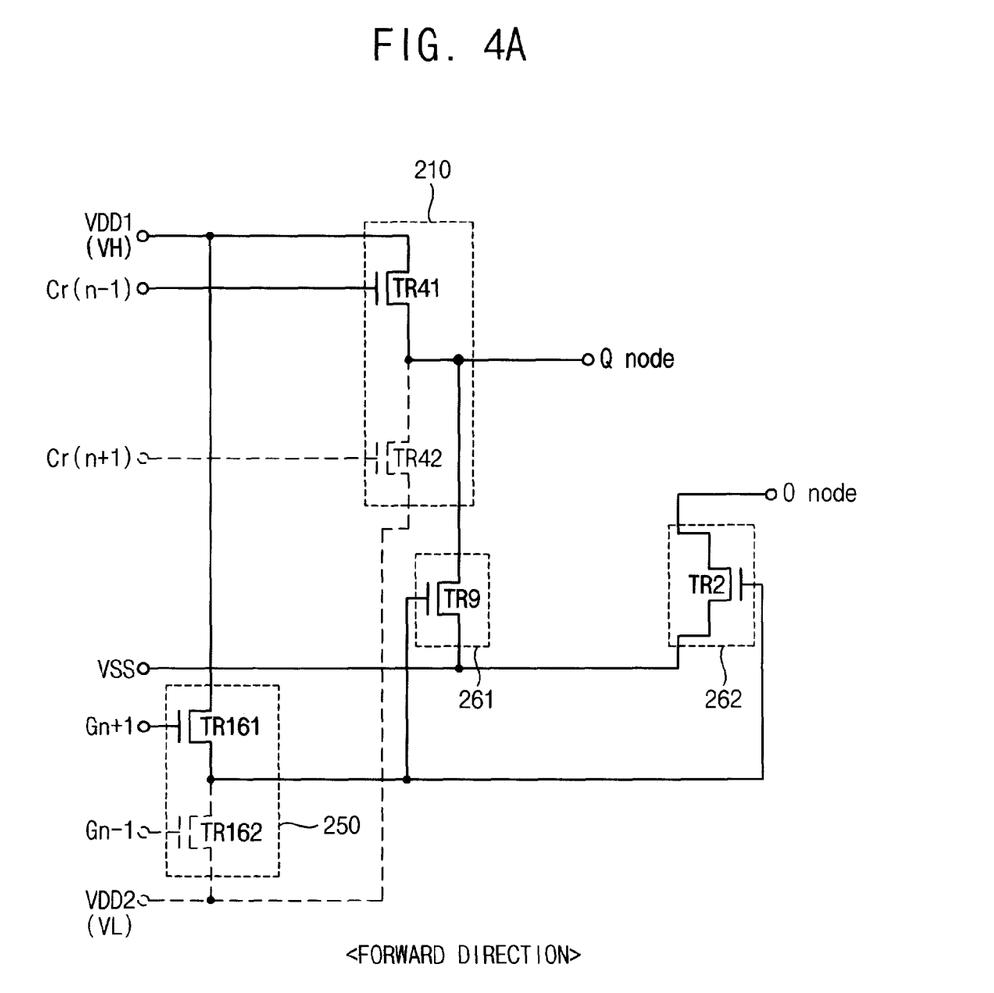
FIGS. 4A and 4B are circuit diagrams illustrating operations of a pull-up controller and a pull-down controller of FIG. 3.
Figure 4B:
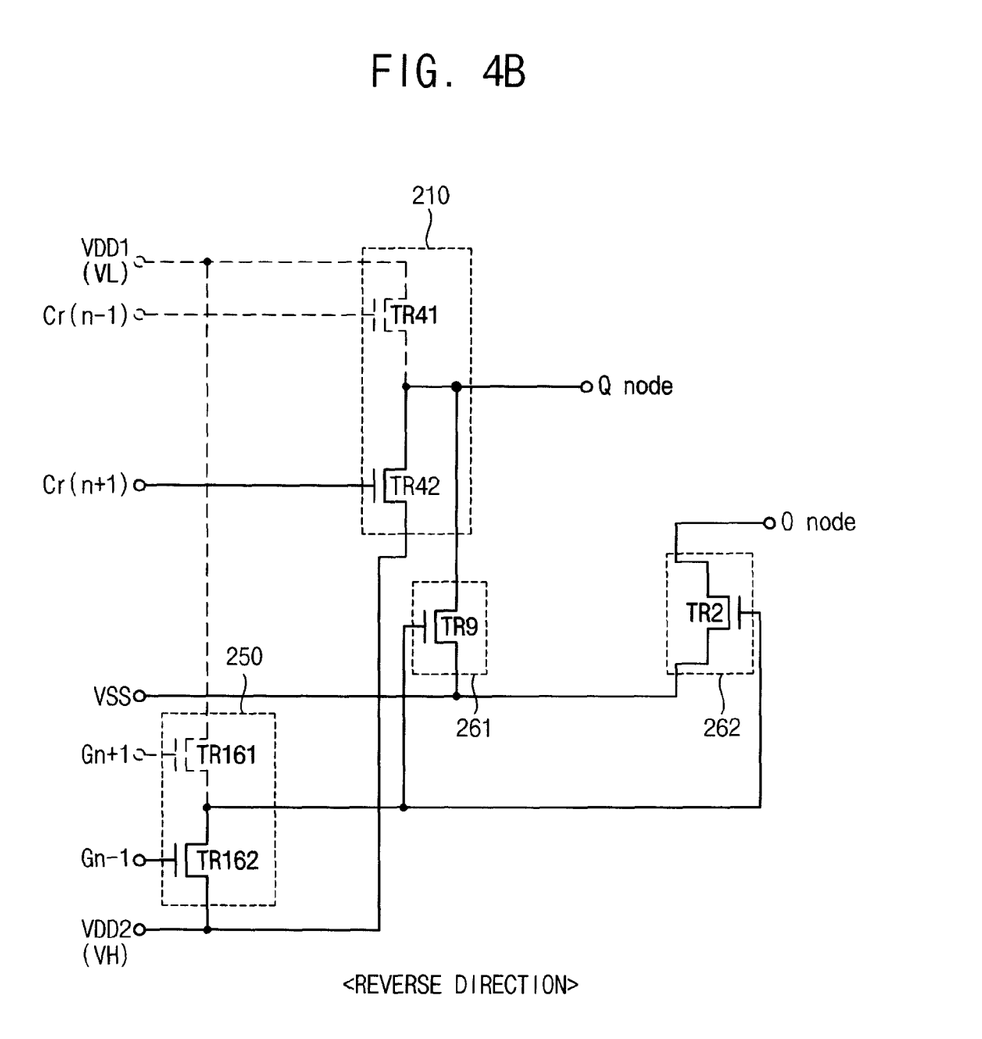

FIGS. 4A and 4B are circuit diagrams illustrating operations of the pull-up controller 210 and the pull-down controller 250 of FIG. 3. Referring to FIGS. 3 and 4A, the operations of the pull-up controller 210 and the pull-down controller 250 in n-th stage SCn, in the forward driving mode DIRf, are explained.

In the forward driving mode DIRf, the first power VDD1 has the high voltage VH, and the second power VDD2 has the low voltage VL. The operations of the pull-up controller 210 is as followed. According to the forward driving mode DIRf, the high voltage VH, which is the carry signal Crn−1 from the n−1 th stage SCn−1 being the previous stage, is applied to the control electrode of the first control transistor TR41. Thus, the first control transistor TR41 is turned on. In addition, according to the forward driving mode DIRf, the low voltage VL, which is the carry signal Crn+1 from the (n+1)-th stage SCn+1 being the following stage, is applied to the control electrode of the second control transistor TR42. Thus the second control transistor TR42 is turned off.

As the first control transistor TR41 is turned on, the first power VDD1, having the high voltage VH applied to the input electrode of the first control transistor TR41, is applied to the first node Q.

The operations of the pull-down controller 250 is as followed. According to forward driving mode, the high voltage VH, which is the gate signal Gn+1 from the (n+1)-th stage SCn+1 being the following stage, is applied to the control electrode of the third control transistor TR161 of the pull-down controller 250. Thus, the third control transistor TR161 is turned on. Alternatively, according to forward driving mode, the off voltage VSS, which is the gate signal Gn−1 from the (n−1)-th stage SCn−1 being the previous stage, is applied to the control electrode of the fourth control transistor TR162 of the pull-down controller 250. Thus, the fourth control transistor TR162 is turned off.

As the third control transistor TR161 is turned on, the first power VDD1, having the high voltage VH applied to the input electrode of the third control transistor TR161, is applied to each of the control electrodes of the first and second pull-down parts 261 and 262. The first pull-down part 261 is turned on, and thus, the voltage of the first node Q is pulled down to be the off voltage VSS. The second pull-down part 262 is turned on, and thus, the voltage of the second node O is pulled down to be the off voltage VSS.

Referring to FIGS. 3 and 4B, operation of the pull-up controller 210 and the pull-down controller 250 in n-th stage SCn, in the reverse driving mode are explained. In the reverse driving mode DIRr, a first power VDD1 has the low voltage VL, and a second power VDD2 has the high voltage VH.

The operations of the pull-up controller 210 is as followed. According to the forward driving mode DIRf, the low voltage VL, which is the carry signal Crn−1 from the (n−1)-th stage SCn−1 being the previous stage, is applied to the control electrode of the first control transistor TR41. Thus, the first control transistor TR41 is turned off. The high voltage VH, which is the carry signal Crn+1 from the (n+1)-th stage SCn+1 being the following stage, is applied to the control electrode of the second control transistor TR42. Thus, the second control transistor TR42 is turned on.

As the second control transistor TR42 is turned on, the second power VDD2, having the high voltage VH applied to the input electrode of the second control transistor TR42, is applied to the first node Q.

The operations of the pull-down controller 250 is as followed. According to reverse driving mode, the high voltage VH, which is the gate signal Gn−1 of the following stage, the (n−1)-th stage SCn−1, is applied to the control electrode of the fourth control transistor TR162 of the pull-down controller 250. Thus, the fourth control transistor TR162 is turned on. Alternatively, according to reverse driving mode, the off voltage VSS, which is the gate signal Gn+1 of the previous stage, the (n+1)-th stage SCn+1, is applied to the control electrode of the third control transistor TR161 of the pull-down controller 250. Thus, the third control transistor TR161 is turned off.

As the fourth control transistor TR162 is turned on, the second power VDD2, having the high voltage VH is applied to each of the control electrodes of the first and second pull-down parts 261 and 262. The first pull-down part 261 is turned on, and thus, the voltage of the first node Q is pulled down to be the off voltage VSS. The second pull-down part 262 is turned on, and thus, the voltage of the second node O is pulled down to be the off voltage VSS.

Figure 5:
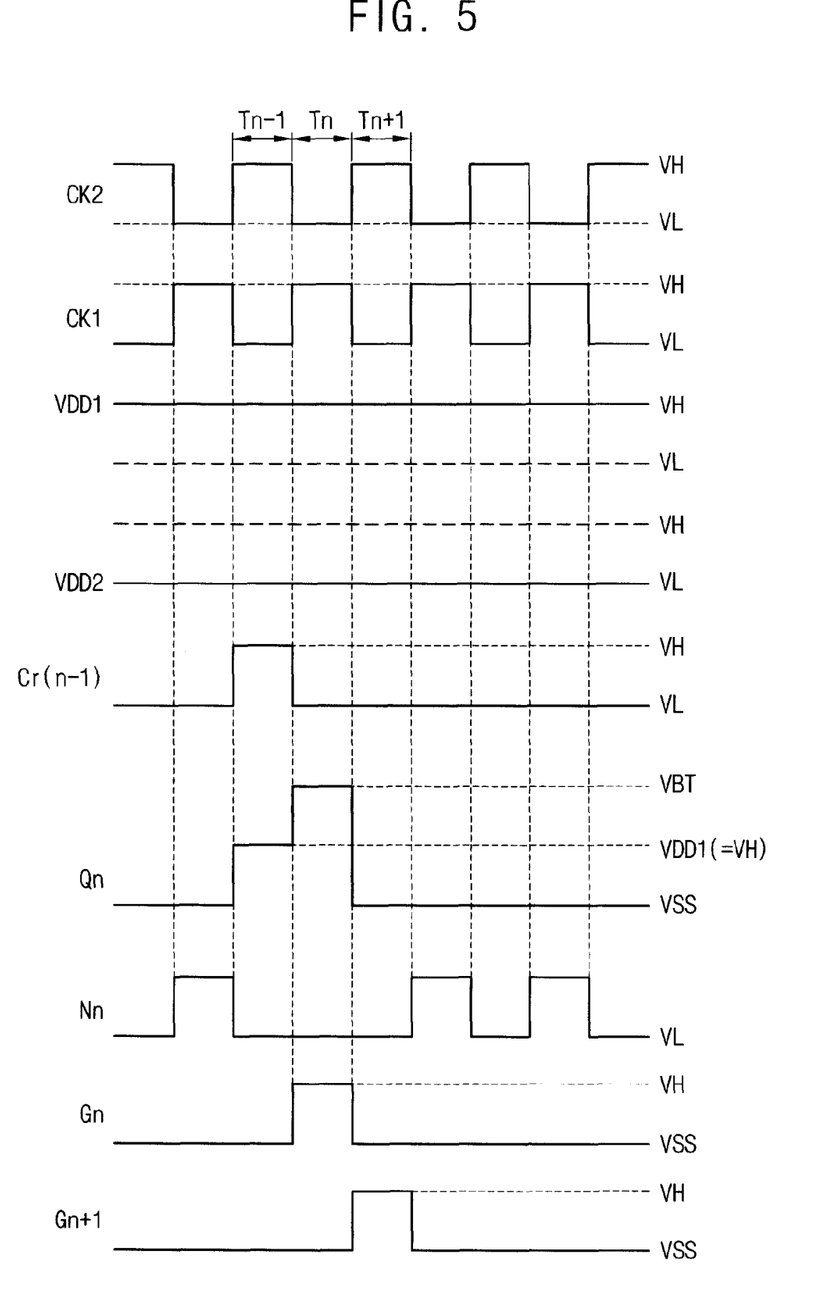
FIG. 5 is a waveform diagram showing input/output signals of the n-th stage when the gate driving circuit of FIG. 2 is driven in a forward driving mode.

FIG. 5 is a waveform diagram showing input/output signals of the n-th stage, when the gate driving circuit of FIG. 2 is driven in the forward direction (first order).

Referring to FIGS. 2, 3 and 5, in the forward driving mode DIRf, the first gate start signal STVP1 having the high voltage VH, the first power VDD1 having the high voltage VH, the second gate start signal STVP2 having the low voltage VL, the second power VDD2 having the low voltage VL, the off voltage VSS, the first clock signal CK1, and the second clock signal CK2 are applied to the gate driving circuit 200.

The first power VDD1 having the high voltage VH, the second power VDD2 having the low voltage VL, the off voltage VSS, the first clock signal CK1, and the second clock signal CK2 are applied to the stages SCd1, SC1, . . . , SCn−1, SCn, SCn+1, . . . , SCm, SCd2 of the shift register 230. In the first dummy stage SCd1, which is the first stage of the forward driving mode DIRf, the first gate start signal STVP1 having the high voltage VH is applied to the first input terminal IN1, and the second gate start signal STVP2 having the low voltage VL is applied to the second input terminal IN2. In the second dummy stage SCd2, which is the last stage of the forward driving mode DIRf, the second gate start signal STVP2 having the off voltage VSS is applied to the third input terminal IN3, and the first gate start signal having the high voltage VH is applied to the fourth input signal IN4.

Accordingly, the shift register 230 is sequentially driven in the forward direction (first order). Hereinafter, the shift register 230 in the forward driving mode will be explained referring operations of the n-th stage SCn. In FIG. 5, Qn is a waveform diagram of a signal applied to the first node Q of the n-th stage SCn. Nn is a waveform diagram of a signal applied to the third node N of the n-th stage SCn.

When the control electrode of the first control transistor TR41 receives the (n−1)-th carry signal Cr(n−1) having the high voltage VH, during an (n−1)-th period Tn−1 in one frame of the n-th stage SCn, the first power VDD1 having the high voltage VH is applied to the first node Q. The first power VDD1 applied to the first node Q is charged by the charging part 220. The third node N is supplied with the low voltage VL synchronized with the first clock signal CK1.

When the pull-up part 230 receives the first clock signal CK1 having the high voltage VH, during an n-th period Tn, the pull-up part 230 is bootstrapped. The first node Q connected to the control electrode of the pull-up part 230 is boosted to be a boosting voltage VBT. For example, the first node Q has the high voltage VH during the (n−1)-th period Tn−1, and has the boosting voltage VBT during the n-th period. During the n-th period Tn, in which the boosting voltage VBT is applied to the first node Q, the pull-up part 230 outputs the high voltage VH of the first clock signal CK1, as the high voltage VH of the n-th gate signal Gn. While the n-th gate signal Gn having the high voltage VH is outputted, the eighth transistor TR8 and the thirteenth transistor TR13 are turned on, in response to the n-th gate signal Gn having the high voltage VH. Thus, the third node N is discharged as the low voltage VL.

During an (n+1)-th period Tn+1, the (n+1)-th gate signal Gn+1 is received by the third control transistor TR161 of the pull-down controller 250. For example, the control electrode of the third control transistor TR161 receives the (n+1)-th gate signal Gn+1 having the high voltage VH, and in response thereto, the third control transistor TR161 is turned on. Then, the third control transistor TR161 applies the first power VDD1 having the high voltage VH to the first and second pull-down parts 261 and 262. The first pull-down part 261 pulls down the boosting voltage VBT of the first node Q to the off voltage VSS. The second pull-down part 262 pulls down the high voltage VH, of the gate signal Gn applied to the second node O, to the off voltage VSS.

After the (n+1)-th period, during the remaining period of the frame, the first maintenance part 281 maintains the voltage of the second node O as the off voltage VSS, in response to the high voltage VH of the second clock signal CK2. The second maintenance part 282 maintains the voltage of the first node Q as the off voltage VSS, in response to the high voltage VH of the first clock signal CK1. The third maintenance part 283 maintains the voltage of the second node O as the off voltage VSS, in response to the high voltage VH applied to the third node N. The first, second, and third maintenance parts 281, 282, and 283 maintain the n-th gate signal Gn as the off voltage VSS.

According to the above-mentioned stage driving method, the first to m-th stages SC1, . . . , SCm are forwardly driven to sequentially output the first to m-th gate signals G1, G2, . . . , Gm).

Figure 6:
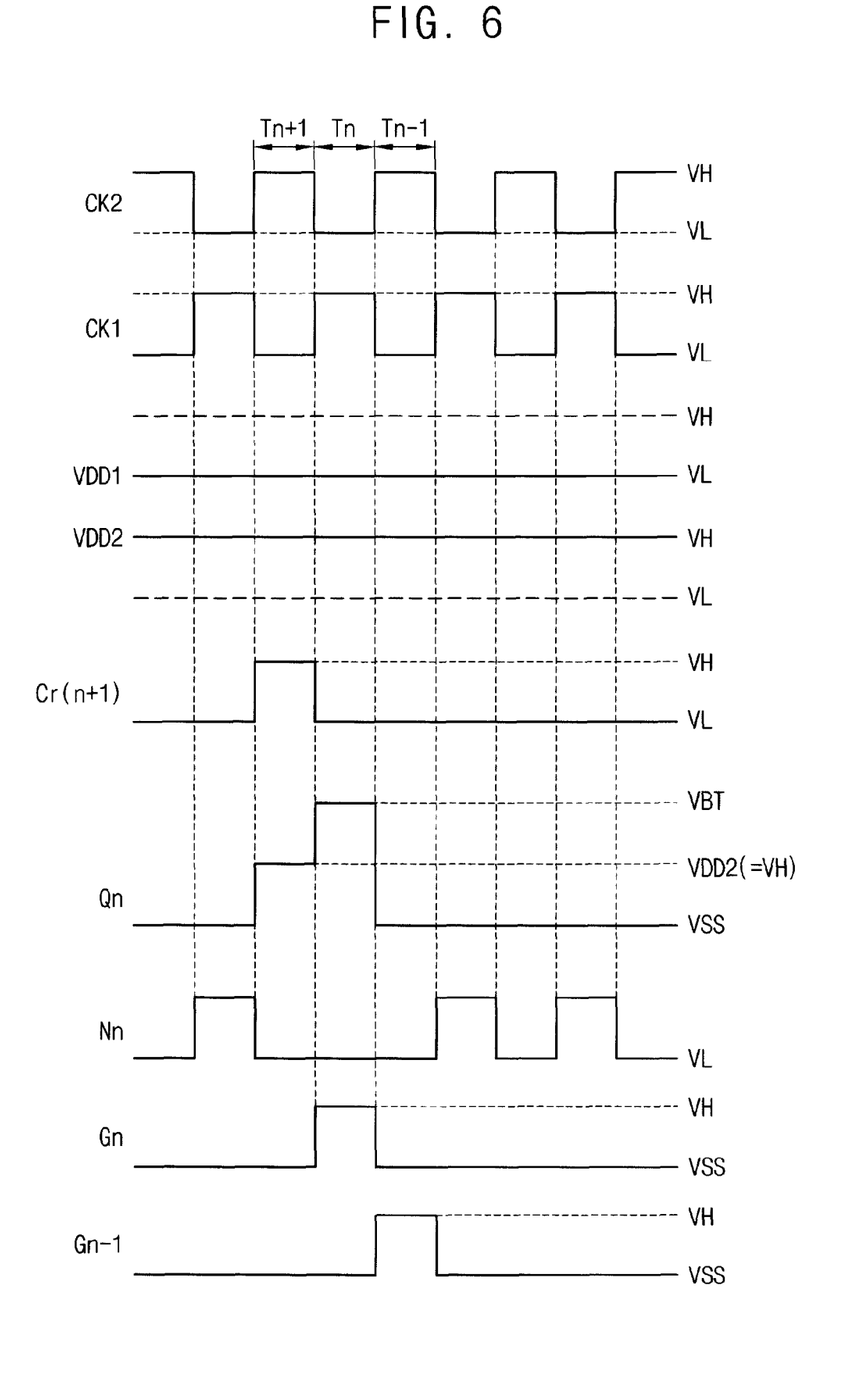
FIG. 6 is a waveform diagram showing the input/output signals of the n-th stage when the gate driving circuit of FIG. 2 is driven in a reverse driving mode.

FIG. 6 is a waveform diagram showing the input/output signals of the n-th stage, when the gate driving circuit of FIG. 2 is reversely driven.

Referring to FIGS. 2, 3, and 6, in the reverse driving mode DIRr, the first gate start signal STVP1 having the low voltage VL, the first power VDD1 having the off voltage VSS, the second gate start signal STVP2 having the high voltage VH, the second power VDD2 having the high voltage VH, an off voltage VSS, a first clock signal CK1, and a second clock signal CK2 are applied to the gate driving circuit 200.

The first power VDD1 having the low voltage VL, the second power VDD2 having the high voltage VH, the off voltage VSS, the first clock signal CK1, and the second clock signal CK2 are applied to each of the stages SCd1, SC1, . . . , SCn−1, SCn, SCn+1, . . . , SCm, SCd2 of the shift register 230. According to the reverse driving mode DIRr, the second gate start signal STVP2 having the high voltage VH is applied to the third input terminal IN3 of the second dummy stage SCd2, which is the first stage. The first gate start signal STVP1 having the low voltage VL is applied to the fourth input terminal IN4 of the second dummy stage SCd2, which is the first stage. According to the reverse driving mode DIRr, the first gate start signal STVP1 having the low voltage VL is applied to the first input terminal IN1 of the first dummy stage SCd1, which is the last stage. The second gate start signal STVP2 having the high voltage VH is applied to the second input terminal IN2 of the first dummy stage SCd1.

Accordingly, the stages of the shift register 230 are sequentially driven in a second order that is opposite to the first order. Hereinafter, the shift register 230 in the reverse driving mode will be explained referring operations of the n-th stage SCn. In FIG. 6, Qn is a waveform diagram of a signal applied to the first node Q of the n-th stage SCn. Nn is a waveform diagram of a signal applied to the third node N of the n-th stage SCn.

When, the control electrode of the second control transistor TR42 receives the (n+1)-th carry signal Cr(n−1) having the high voltage VH, during an (n+1)-th period Tn+1 in one frame of the n-th stage SCn, the second power VDD2 having the high voltage VH is applied to the first node Q. The second power VDD2 applied to the first node Q is charged by the charging part 220. The third node N is supplied with the low voltage VL synchronized with the first clock signal CK1.

When the pull-up part 230 receives the first clock signal CK1 having the high voltage VH during the n-th period Tn, the pull-up part 230 is bootstrapped. The first node Q connected to the control electrode of the pull-up part 230 is boosted to be the boosting voltage VBT. For example, the first node Q has the high voltage VH during the (n+1)-th period Tn+1, and has the boosting voltage VBT during the n-th period Tn. During the N-th period Tn, in which the boosting voltage VBT is applied to the first node Q, the pull-up part 230 outputs the high voltage VH of the first clock signal CK1, as the high voltage VH of the n-th gate signal Gn. While the n-th gate signal Gn having the high voltage VH is outputted, the eighth transistor TR8 and the thirteenth transistor TR13 are turned on in response to the n-th gate signal Gn having the high voltage VH. Thus, the third node N is discharged as the low voltage VL.

During the (n−1)-th period Tn−1, the (n−1)-th gate signal Gn−1 is received by the fourth control transistor TR162 of the pull-down controller 250. For example, the control electrode of the fourth control transistor TR162 receives the (n−1)-th gate signal Gn−1 having the high voltage VH, and in response thereto, the fourth control transistor TR162 is turned on. Thus, the fourth control transistor TR162 applies the second power VDD2 having the high voltage VH to the first and second pull-down parts 261 and 262. The first pull-down part 261 pulls down the boosting voltage VBT of the first node Q, to the off voltage VSS. The second pull-down part 262 pulls down the high voltage VH of the gate signal Gn applied to the second node O, to the off voltage VSS.

After the (n−1)-th period Tn−1, during the remaining period of the frame, the first maintenance part 281 maintains the voltage of the second node O as the off voltage VSS, in response to the high voltage VH of the second clock signal CK2. The second maintenance part 282 maintains the voltage of the first node Q as the off voltage VSS, in response to the high voltage VH of the first clock signal CK1. The third maintenance part 283 maintains the voltage of the second node O as the off voltage VSS, in response to the high voltage VH of the third node N. The first, second, and third maintenance parts 281, 282, and 283 maintain the n-th gate signal Gn as the off voltage VSS.

According to aspects of the above-mentioned stage driving method, the m-th to first stages SCm, . . . , SC1 are sequentially driven in reverse to output the m-th to first gate signals Gm, Gm−1, . . . , G1.

According to aspects of the present invention, a gate driving circuit may be driven in a forward driving mode and a reverse driving mode, according to a first power, a second power, a first gate start signal, and a second gate start signal.

The foregoing is illustrative of various aspects of the present invention and is not to be construed as limiting thereof. Although a few exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims.

Therefore, it is to be understood that the foregoing is illustrative of the present invention and is not to be construed as limited to the specific exemplary embodiments disclosed, and that modifications to the disclosed exemplary embodiments, as well as other exemplary embodiments, are intended to be included within the scope of the appended claims. The present invention is defined by the following claims, with equivalents of the claims to be included therein.

What is claimed is:

1. A gate driving circuit comprising cascade-connected stages to output gate signals, an n-th ("n" is a natural number) one of the stages comprising:
   a pull-up part configured to intermittingly output a first clock signal as an output signal of the n-th stage;
   a pull-up controller configured to selectively apply a first power and a second power to a control electrode of the pull-up part;
   a first pull-down part configured to pull down a voltage applied to the control electrode of the pull-up part to an off voltage;
   a second pull-down part configured to pull down a voltage applied to an output electrode of the pull-up part to the off voltage; and
   a pull-down controller configured to selectively apply the first power and the second power to control electrodes of the first pull-down part and the second pull-down part,
   wherein:
   the pull-up controller comprises:
      a first control transistor comprising a control electrode configured to receive a carry signal from a previous one of the stages or a first gate start signal, an input electrode configured to receive the first power, and an output electrode connected to a first node; and
      a second control transistor comprising a control electrode configured to receive a carry signal from a following one of the stages or a second gate start signal, an input electrode to receive the second power, and an output electrode connected to the first node; and
   levels of the first power and the second power are both different from a level of the off voltage.

2. The gate driving circuit of claim 1, wherein the pull-down controller comprises:
   a third control transistor comprising a control electrode configured to receive an output signal from one of the following stages or the first gate start signal, an input electrode configured to receive the first power, and an output electrode connected to the control electrodes of the first and second pull-down parts; and
   a fourth control transistor comprising a control electrode configured to receive an output signal from one of the previous stages or the second gate start signal, an input electrode configured to receive the second power, and an output electrode connected to the control electrodes of the first and second pull-down parts.

3. The gate driving circuit of claim 2, wherein:
   each of the first power and the first gate start signal has a first level voltage and each of the second power, and the second gate start signal has a second level voltage that is lower than the first level voltage, in a forward driving mode of the driving circuit, during which the stages are sequentially driven in a first direction order;
   each of the first power and the first gate start signal has the second level voltage, and each of the second power and the second gate start signal has the first level voltage, in a reverse driving mode of the gate driving circuit, during which the stages are sequentially driven along a second order opposite to the first order.

4. The gate driving circuit of claim 1, further comprising a carry part comprising a control electrode electrically connected to the control electrode of the pull-up part, an input electrode configured to receive the first clock signal, and an output electrode electrically connected to the control electrode of the pull-up part, through a capacitor.

5. The gate driving circuit of claim 1, further comprising:
   a first maintenance part configured to maintain a voltage applied to the output electrode of the pull-up part at the off voltage, in response to a second clock signal different from the first clock signal; and
   a second maintenance part configured to maintain a voltage applied to the control electrode of the pull-up part at the off voltage, in response to the first clock signal.

6. The gate driving circuit of claim 1, further comprising a switching part configured to output the off voltage when a voltage having a higher level than the off voltage is applied to the control electrode of the pull-up part, and to output a signal synchronized with the first clock signal when the off voltage is applied to the control electrode of the pull-up part.

7. The gate driving circuit of claim 6, further comprising a third maintenance part configured to maintain a voltage applied to the output electrode of the pull-up part at the off voltage.

8. A display apparatus comprising:
   a display panel comprising a display area where an image is displayed and a peripheral area surrounding the display area, the display panel comprising gate lines and data lines disposed in the display area;
   a gate driving circuit disposed in the peripheral area and comprising stages configured to output gate signals to the gate lines; and
   a main driving circuit configured to provide a first power, a second power, a first gate start signal, and a second gate start signal to the gate driving circuit, according to a direction in which the image is formed on the display panel,
   wherein:
   an n-th one of the stages ("n" is a natural number) of the gate driving circuit comprises:
      a pull-up part configured to output a first clock signal as an output signal of the n-th stage;
      a pull-up controller configured to selectively apply the first and second powers to a control electrode of the pull-up part;
      a first pull-down part configured to pull down a voltage applied to the control electrode of the pull-up part to an off voltage;
      a second pull-down part configured to pull down a voltage applied to an output electrode of the pull-up part to the off voltage;
      a pull-down controller configured to selectively apply the first and second powers to control electrodes of the first and second pull-down parts; and
   the pull-up controller comprises:
      a first control transistor comprising a control electrode configured to receive a carry signal from a previous one of the stages or a first gate start signal, an input electrode configured to receive the first power, and an output electrode connected to a first node; and
      a second control transistor comprising a control electrode configured to receive a carry signal from a next one of the stages or a second gate start signal, an input electrode configured to receive the second power, and an output electrode connected to the first node; and
   levels of the first power and the second power are both different from a level of the off voltage.

9. The display apparatus of claim 8, wherein the pull-down controller comprises:
   a third control transistor comprising a control electrode configured to receive an output signal from one of the following stages or the first gate start signal, an input electrode configured to receive the first power, and an output electrode connected to the control electrodes of the first and second pull-down parts; and a fourth control transistor comprising a control electrode configured to receive an output signal from a previous one of the stages or the second gate start signal, an input electrode configured to receive the second power, and an output electrode connected to the control electrodes of the first and second pull-down parts.

10. The display apparatus of claim 9, wherein:

each of the first power and the first gate start signal has a first level voltage, and each of the second power and the second gate start signal has a second level voltage that is lower than the first level voltage, during a forward driving mode of the driving circuit, during which the stages are sequentially driven in a first order; and each of the first power and the first gate start signal has the second level voltage, and each of the second power and the second gate start signal has the first level voltage, during a reverse driving mode of the driving circuit, during which the stages are sequentially driven in a second order opposite to the first order.

11. The display apparatus of claim 8, wherein the gate driving circuit further comprises a carry part comprising a control electrode electrically connected to the control electrode of the pull-up part, an input electrode configured to receive the first clock signal, and an output electrode electrically connected to the control electrode of the pull-up part through a capacitor.

12. The display apparatus of claim 8, wherein the gate driving circuit further comprises:

a first maintenance part configured to maintain a voltage applied to the output electrode of the pull-up part at the off voltage, in response to a second clock signal different from the first clock signal; and a second maintenance part configured to maintain a voltage applied to the control electrode of the pull-up part at the off voltage, in response to the first clock signal.

13. The display apparatus of claim 8, wherein the gate driving circuit further comprises a switching part configured to output the off voltage, when a voltage having a higher level than the off voltage is applied to the control electrode of the pull-up part, and to output a signal synchronized with the first clock signal, when the off voltage is applied to the control electrode of the pull-up part.

14. The display apparatus of claim 13, wherein the gate driving circuit further comprises a third maintenance part configured to maintain a voltage applied to the output electrode of the pull-up part at the off voltage.

15. A gate driving circuit comprising a plurality of cascade-connected stages to output gate signals, the circuit comprising:

a first stage configured to receive a first power and a second power, and to output a first gate signal; and a second stage immediately adjacent to the first stage, the second stage configured to receive the first power and the second power, and to output a second gate signal, wherein:

during a first horizontal period 1H, the first power has a high level and the second power has a low level, and the first gate signal precedes the second gate signal;

during a second horizontal period 1H following the first horizontal period 1H, the first power has the low level and the second power has the high level, and the second gate signal precedes the first gate signal;

the first stage comprises:

a pull-up part configured to intermittingly output a first clock signal as the first gate signal;

a pull-up controller configured to selectively apply the first power and the second power to a control electrode of the pull-up part;

a first pull-down part configured to pull down a voltage applied to the control electrode of the pull-up part to an off voltage;

a second pull-down part configured to pull down a voltage applied to an output electrode of the pull-up part to the off voltage; and a pull-down controller configured to selectively apply the first power and the second power to control electrodes of the first pull-down part and the second pull-down part;

the pull-up controller comprises:

a first control transistor comprising a control electrode configured to receive a carry signal from a third stage preceding the first stage, an input electrode to receive the first power, and an output electrode connected to a first node; and a second control transistor comprising a control electrode configured to receive a carry signal from the second stage, an input electrode to receive the second power, and an output electrode connected to the first node; and levels of the first power and the second power are both different from a level of the off voltage.

16. The gate driving circuit of claim 15, wherein the pull-down controller comprises:

a third control transistor comprising a control electrode configured to receive the second gate signal, an input electrode configured to receive the first power, and an output electrode connected to the control electrodes of the first pull-down part and the second pull-down part; and a fourth control transistor comprising a control electrode configured to receive an output signal from the third stage, an input electrode configured to receive the second power, and an output electrode connected to the control electrodes of the first pull-down part and the second pull-down part.

* * * * *